(12) United States Patent
Brunelle et al.

(10) Patent No.: US 7,550,985 B2
(45) Date of Patent: Jun. 23, 2009

(54) METHODS OF TESTING MEMORY DEVICES

(75) Inventors: Steven J. Brunelle, Boise, ID (US);
Saeed Momenpour, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/494,038

(22) Filed: Jul. 27, 2006

(65) Prior Publication Data
US 2006/0261839 A1    Nov. 23, 2006

Related U.S. Application Data

(62) Division of application No. 10/928,385, filed on Aug. 27, 2004, now Pat. No. 7,202,681, which is a division of application No. 09/908,511, filed on Jul. 18, 2001, now Pat. No. 6,788,081.

(51) Int. Cl.
*G01R 31/02* (2006.01)
*G01R 31/28* (2006.01)

(52) U.S. Cl. ........................ 324/755; 324/765
(58) Field of Classification Search ......... 324/754–765, 324/158.1; 365/201; 714/718–723
See application file for complete search history.

(56) References Cited

U.S. PATENT DOCUMENTS

| | | | |
|---|---|---|---|
| 2,023,947 A | 12/1935 | Auble | |
| 2,951,185 A | 8/1960 | Buck | |
| 3,808,532 A | 4/1974 | Yuska | |
| 3,829,741 A | 8/1974 | Athey | |
| 3,850,492 A | 11/1974 | Moore | |
| 3,904,861 A | 9/1975 | McNamara | |
| 4,080,028 A | 3/1978 | Gilbert | |
| 4,230,986 A | 10/1980 | Deaver et al. | |
| 4,231,629 A | 11/1980 | Kirby | |
| 4,573,753 A | 3/1986 | Vogl | |
| 4,795,977 A | 1/1989 | Frost et al. | |
| 4,862,327 A | 8/1989 | Ansell et al. | |
| 4,924,179 A | 5/1990 | Sherman | |
| 5,010,446 A | 4/1991 | Scannell | |
| 5,257,166 A | 10/1993 | Marui et al. | |
| RE34,491 E | 12/1993 | Driller et al. | |
| 5,283,605 A | 2/1994 | Lang-Dahlke | |
| 5,430,847 A | 7/1995 | Bradley et al. | |
| 5,523,695 A * | 6/1996 | Lin | 324/755 |
| 5,524,232 A | 6/1996 | Hajeer | |
| 5,537,295 A | 7/1996 | Van Den Bout et al. | |
| 5,559,672 A | 9/1996 | Buras | |
| 5,583,749 A | 12/1996 | Tredennick et al. | |

(Continued)

*Primary Examiner*—Ernest F Karlsen
(74) *Attorney, Agent, or Firm*—TraskBritt (57) ABSTRACT

A testing apparatus, system and method for testing computer memory modules are disclosed. The apparatus includes a motherboard having a processor and at least one resident memory socket fixed to the motherboard. A remote memory socket is provided and located a distance from the resident memory socket, such as on a periphery of the motherboard. The remote memory socket is coupled to the resident memory socket by a conductor assembly such as a ribbon cable and an adapter. A memory module is placed in the remote memory socket and tested using a signal or combination of signals from the processor. A plurality of motherboards, each being configured with remote memory sockets, may be combined to form a testing system suitable for use with an automated handler.

5 Claims, 5 Drawing Sheets

U.S. PATENT DOCUMENTS

| | | |
|---|---|---|
| 5,625,534 A | 4/1997 | Okaya et al. |
| 5,667,388 A | 9/1997 | Cottrell |
| 5,764,924 A | 6/1998 | Hong |
| 5,781,747 A | 7/1998 | Smith et al. |
| 5,793,620 A | 8/1998 | Burnworth et al. |
| 5,822,182 A | 10/1998 | Scholder et al. |
| 5,853,297 A | 12/1998 | Moulton et al. |
| 5,919,259 A | 7/1999 | Dahl |
| 5,928,024 A | 7/1999 | Ming-Huang |
| 6,089,879 A | 7/2000 | Babcock |
| 6,216,184 B1 | 4/2001 | Fackenthall et al. |

\* cited by examiner

METHODS OF TESTING MEMORY DEVICES

CROSS-REFERENCE TO RELATED APPLICATIONS

This application is a divisional of application Ser. No. 10/928,385, filed Aug. 27, 2004, now U.S. Pat. No. 7,202, 681, issued Apr. 10, 2007, which is a divisional of application Ser. No. 09/908,511, filed Jul. 18, 2001, now U.S. Pat. No. 6,788,081, issued Sep. 7, 2004.

BACKGROUND OF THE INVENTION

1. Field of the Invention

The present invention relates generally to semiconductor testing devices and componentry. More specifically, the present invention relates to devices and systems configured for operation and testing of random access memory (RAM) modules.

2. State of the Art

Semiconductor integrated circuit (IC) devices are manufactured on wafers or other substrates of semiconductor material. Conventionally, many IC devices are manufactured on a single substrate and individual devices or groups of IC devices are cut or "singulated" from the substrate and packaged. The IC devices are tested at various points during the manufacturing process, e.g., while they are still in substrate form, in bare die form (after singulation but prior to packaging), and after packaging.

Testing may be directed towards detection of flaws or errors regarding one or more facets of semiconductor fabrication. For example, one stage of testing concerns the physical structure of the IC device. Such testing may include the use of various techniques known in the art such as emission microscopes or X-ray analysis. Testing of the structure typically focuses on whether discernible errors or flaws have developed during the physical formation of the semiconductor die. Such flaws may be the result of one or more processing steps improperly performed such as over-etching. Flaws are also developed as a result of contaminants introduced during the fabrication process. Indeed, numerous process factors exist which may influence the introduction and development of such flaws or errors.

Another facet of testing concerns the functionality and performance of the IC device. This typically involves connecting the IC device to an external circuit such that a signal or combination of signals may be passed through the device. The response by the IC device to the signal is then monitored and output values compared to values expected to be obtained from a properly functioning IC device of that design. Tests may involve a particular signal or combination of signals being delivered repetitively, perhaps under extreme environmental conditions (temperature, voltage, etc.) in order to identify an IC device which would fail after a shorter than satisfactory period of operation. Other tests may involve the delivery of a number of different signals or signal combinations in sequence. One method, compression testing, for testing a memory device includes delivering the same signal or signal combination to multiple identical subsections of the memory device simultaneously and comparing the values read from the subsections. If all of the respective read values match, the test has been passed, while a mismatch between respective values read from any of the subsections indicates a device malfunction and failure of the test.

An obvious intent of IC device testing is to produce an IC device having verified reliability and quality. While this objective is significant, the efficiency with which testing is performed is also an important concern, as speed of testing is a limiting factor in fabricating IC devices and assemblies. It then becomes desirable to reduce testing time whenever possible without compromising the integrity of the testing process. A reduction in test time without a sacrifice in quality results in lower manufacturing costs by increasing throughput and thus yield. Reduced manufacturing costs are very desirable in that they may ultimately lead to higher profits for a company or its shareholders, as well as provide a cost savings to the consumer by enabling price reductions.

One method of reducing test time without compromising the integrity of the testing process is to perform batch tests. In other words, numerous IC devices are tested coterminously instead of sequentially, one at a time. An example of such testing, with specific regard to memory devices, may be better understood with reference to FIG. 1. A testing apparatus 10 may include a plurality of motherboards 12 housed in a holding device such as a cabinet or a frame 14. A plurality of memory devices, such as RAM memory modules 16, are appropriately coupled to individual memory sockets 18. Each memory socket 18 is operatively coupled to a motherboard 12 with each motherboard 12 including multiple memory sockets 18. Thus, each motherboard 12 is capable of accommodating several memory modules 16 during a given testing operation.

Figure 1:
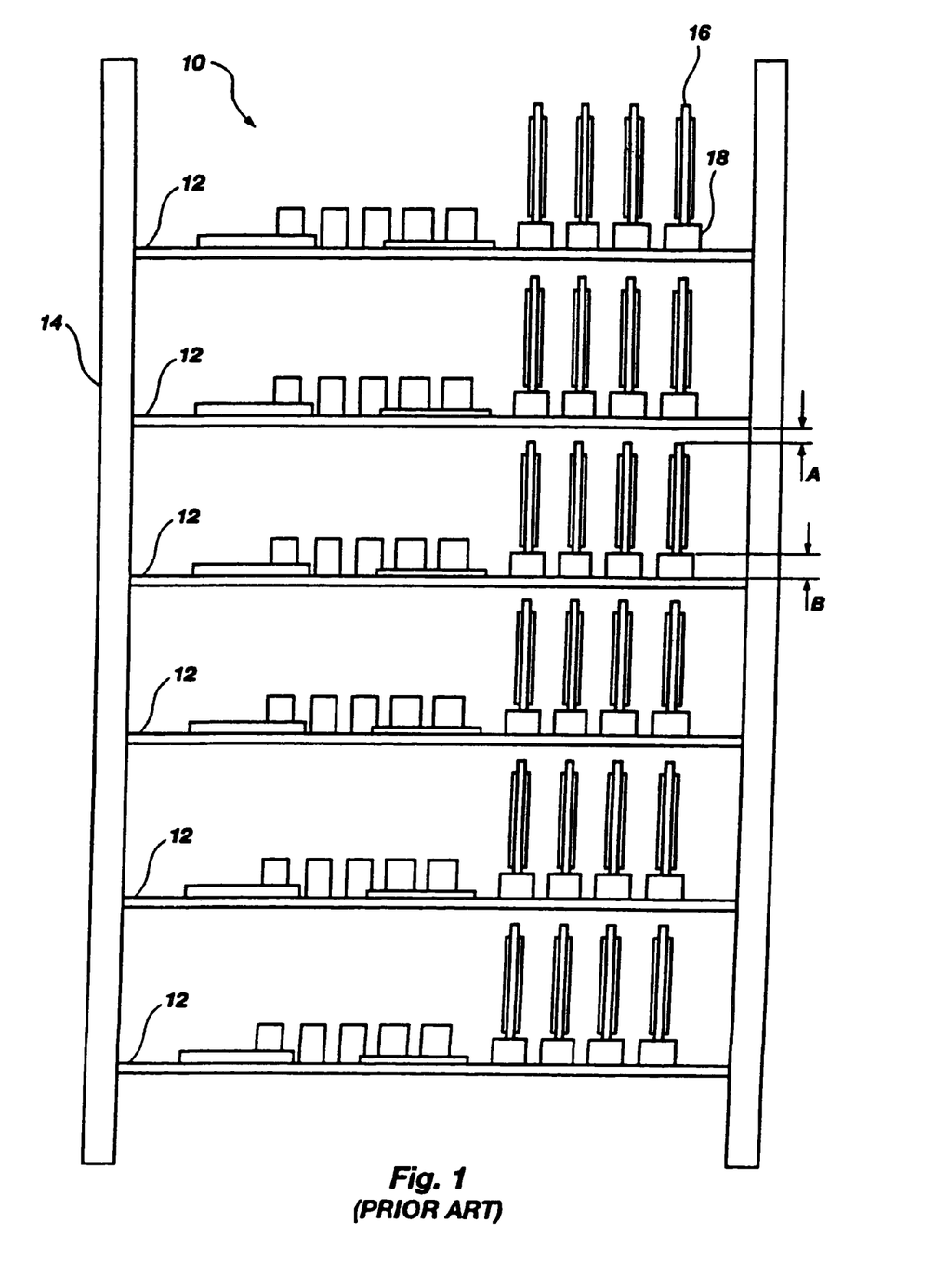
FIG. 1 is an elevational view depicting a prior art memory testing system.

With the memory modules 16 in place, electrical or functional testing of the memory modules 16 is conducted. As described above, the motherboards 12 provide a signal or signals to the RAM memory modules 16 and then are employed to monitor the responsive output of each RAM memory module 16. The configuration as described above allows numerous memory modules 16 to be tested in a relatively short amount of time. However, while the above-described system allows for a greater quantity of devices to be tested at a given time, the turnaround time in removing tested modules and subsequent installment of untested modules is less than optimal.

One problem with a testing apparatus configuration as illustrated in FIG. 1 is that, in a structure configured to maximize the number of memory modules 16 being tested at a given time, the ability to rapidly change the memory modules 16 becomes hampered. This primarily results from the density and close proximity of the motherboards 12 within the cabinet 14 combined with the locations and configurations of the memory sockets 18 on the motherboard 12. A typical motherboard 12 is configured such that the memory sockets 18 are mounted along a planar surface of the motherboard 12, causing the memory modules 16 to extend away from the motherboard 12 in a perpendicular manner. Furthermore, the memory sockets 18 are typically fixed in their locations by mechanical means including, for example, soldering. Therefore, to extract a memory module 16 from a memory socket 18, the memory module 16 must be moved in a direction perpendicularly away from the planar surface of the motherboard 12. However, in a testing apparatus 10 where the motherboards 12 are configured in close proximity to each other and movement of memory modules 16 is transverse to the plane of the motherboard 12, removal of a memory module 16 becomes rather difficult and time consuming.

For example, still referring to FIG. 1, distance "A" represents the distance between the top of a memory module 16 and an adjacent motherboard 12. Distance "B" represents the minimum distance that the memory module 16 must travel to be removed from the memory socket 18 (i.e., the distance required for the bottom of the memory module 16 to clear the top of the memory socket 18). It may often be the case that distance "B" is greater than distance "A." In such instances, it becomes physically impossible to remove the memory modules 16 (or insert them) unless the motherboards 12 are first removed from the frame 14. With a plurality of motherboards 12 each having a plurality of memory sockets 18, replacement of the memory modules 16 thus becomes a laborious task. Even if the motherboards 12 are arranged so that distance "A" becomes larger than distance "B," it remains difficult for an individual to maneuver his or her hands between the motherboards 12 and complete the task of insertion or removal of the memory modules 16 with any degree of efficiency.

In view of the shortcomings in the art, reducing the time required for the removal and replacement of memory modules during the testing process would be advantageous.

It would also be advantageous to provide an apparatus or system which could accommodate the use of an automated handler to remove and replace memory modules during the testing process. Such a system should be flexible and adaptable to a user's needs, as well as simple to implement and operate.

BRIEF SUMMARY OF THE INVENTION

In accordance with one aspect of the invention, an apparatus for testing memory devices in the form of memory modules is provided. The apparatus includes a motherboard which may have a processor socket coupled to it or a processor directly mounted thereto. At least one resident memory socket is fixed to the motherboard and the at least one resident memory socket is electrically coupled to the processor socket through circuit traces of the motherboard. A remote memory socket is positioned to be adjacent the periphery of the motherboard. The remote memory socket may be fixed to a periphery of the motherboard or to another nearby fixture such as a portion of a housing or a frame supporting the motherboard. An electrical pathway in the form of a conductor assembly is provided between the remote memory socket and the resident memory socket. The electrical pathway may be formed by electrically coupling an adapter to the resident memory socket and then electrically coupling the adapter to the remote memory socket via ribbon cable. The remote memory socket is further positioned such that the memory module is not required to travel in a direction substantially perpendicular to the plane of the motherboard during insertion or removal of the memory module from the memory socket. The apparatus may be configured to include multiple remote memory sockets for receiving and testing multiple memory modules at a given time in association with a like number of resident memory sockets. The flexibility provided by the invention in positioning the remote memory sockets allows for a user-preferred configuration for memory module insertion and removal and ultimately results in enhanced efficiency of various testing operations performed using the apparatus.

In accordance with another aspect of the present invention, a system is provided for testing memory devices in the form of memory modules. The system includes a plurality of motherboards, each being coupled to an input device for providing one or more electrical test signals. Each motherboard includes at least one remote memory socket located adjacent a periphery of the motherboard. Each remote memory socket is positioned such that a memory module is not required to travel in a direction which is substantially perpendicular to the plane of the motherboard during insertion or removal of the memory module from the remote memory socket. The motherboards of the plurality may be mounted to a frame in positions and orientations such that removal and replacement of the memory modules may be effected either by an automated device handler or by an individual without requiring removal of the motherboard from the frame or reaching within the frame.

In accordance with another aspect of the invention, a method is provided for testing a memory device in the form of a memory module. The testing method includes providing a motherboard assembly including a substantially planar carrier substrate, a processor, and at least one resident memory socket. The at least one resident memory socket and processor are electrically coupled to one another by circuit traces of the substrate. A remote memory socket is placed at a periphery of the carrier substrate and electrically coupled to the at least one resident memory socket. A memory module is inserted in the remote memory socket and a test signal is provided to the memory module through the remote memory socket.

The method may further include mounting remote memory sockets in association with a motherboard assembly according to a selected configuration and orientation. For example, a motherboard may be mounted in association with a motherboard assembly to a frame with the remote memory sockets being placed adjacent a periphery of the motherboard and either secured thereto or to an adjacent frame member. An automated memory module handling unit may then be employed for the insertion and removal of memory modules, such insertion and removal facilitated by suitable configuration and orientation of the remote memory sockets.

BRIEF DESCRIPTION OF THE SEVERAL VIEWS OF THE DRAWINGS

The foregoing and other advantages of the invention will become apparent upon reading the following detailed description and upon reference to the drawings in which.

DETALED DESCRIPTION OF THE INVENTION

Figure 2A:
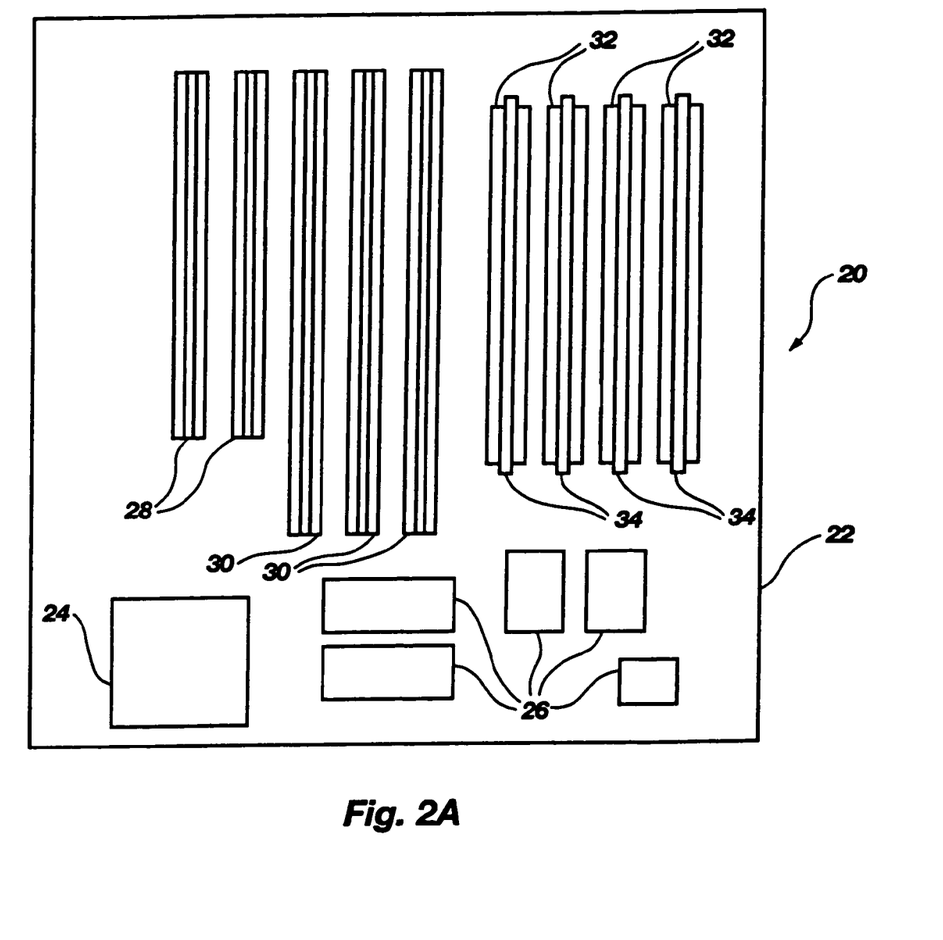
FIG. 2A is a plan view of a motherboard that may be adapted for use according to one embodiment of the invention.
Figure 2B:
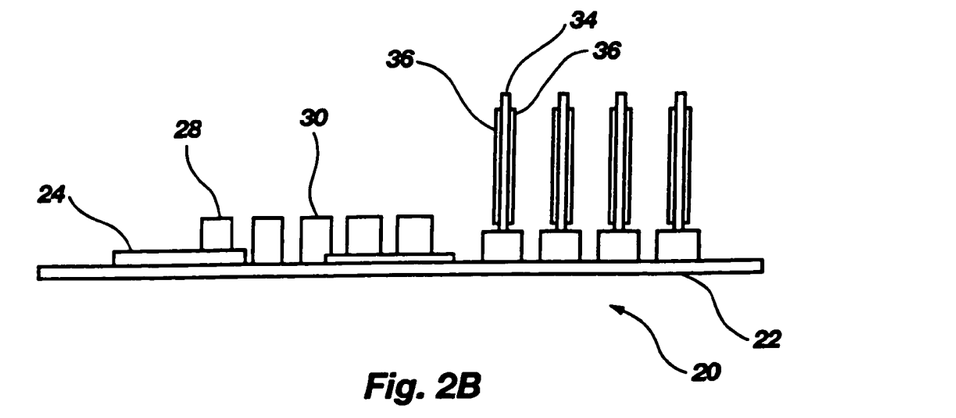
FIG. 2B is an elevational view of the motherboard disclosed in FIG. 2A.

Referring to FIGS. 2A and 2B, a motherboard 20 suitable for use with various embodiments of the present invention is shown. The motherboard 20 is formed as a carrier substrate 22 having circuit traces thereon. The motherboard 20 may include a central processing unit (CPU) 24 in the form of a microprocessor, and may be conventionally configured with a processor socket so that the CPU 24 may be removed from the motherboard 20 and replaced when desired, as is known by those of ordinary skill in the art.

Various other semiconductor devices 26 may also be associated with the motherboard representing such components as chipsets, BIOS or other semiconductor components, which are all well known by those of ordinary skill in the art. Various input/output connections are represented by sockets or slots 28 and 30. The sockets or slots 28 and 30 may include, for example, PCI slots, ISA slots, AGP slots, or connections according to various other standards. The sockets 28 and 30 are included on the motherboard 20 for connection to and communication with input, output and peripheral devices (none shown). Such input, output and peripheral devices may include, for example, a monitor, keyboard, printer, scanner, a secondary input device, such as a mouse or other pointer, a modem and a network card. These devices are conventionally connected to the motherboard 20 by inserting an add-on card into one of the slots 28 or 30 and connecting the device to the add-on card. The add-on cards have independent circuitry and semiconductor devices associated with them and are adapted to interact with the motherboard 20, such that the CPU 24 may process signals received from the add-on card and provide signals to the add-on card for control of the associated device. Alternatively, the motherboard 20 may have many of such conventional connections built in so that add-on cards are not required.

Also connected to the motherboard 20 is a plurality of resident memory sockets or slots 32. A memory device 34 in the form of a memory module is removably coupled to each of the resident memory sockets 32 by insertion of the memory device 34 into the resident memory socket 32 with a force that is substantially perpendicular to the planar surface of the carrier substrate 22. The memory devices 34 may be, as known in the art, retained by a clip, spring, or frictional force of the memory device 34/resident memory socket 32 interface. The memory device 34 of the illustrated embodiment is contemplated as being a module of random access memory (RAM). A RAM module typically consists of a plurality of memory chips 36 secured to one or both sides of a printed circuit board. The memory chips 36 are linked by circuit traces of the circuit board so that the motherboard 20 "sees" them as a continuous memory device.

RAM modules are produced in various forms, such as static RAM (SRAM), dynamic RAM (DRAM), synchronous dynamic RAM (SDRAM), Rambus dynamic RAM (RDRAM), extended data out (EDO), as well as others. The various types of memory devices each have associated logic and structures which allow them to communicate with the CPU 24 through interconnection with the motherboard 20. Typical operation of the memory device 34 entails receiving digital data from the CPU 24 in the form of electrical signals and retaining the information for later retrieval. In addition to the various types of memory devices available, memory devices are also available in different interface styles. In other words, the type of memory socket used must be physically compatible with the memory device being coupled with it. Exemplary interfaces used in the industry are known as single in-line memory modules (SIMMs), dual in-line memory modules (DIMMs) and small outline DIMMs (SODIMMs). SIMMs, DIMMs and SODIMMs differ in the number of conductive connections required between the memory module and the motherboard, as well as the bus width supported by each (the amount of data allowed to be transferred at a given time). SODIMMs are often configured for use where space is at a premium such as in notebook computers. In addition to the standard interfaces, there are also proprietary interfaces designed by manufacturers for use in specific systems. The differences between these memory types and interfaces are well understood by those of ordinary skill in the art and are not, therefore, discussed in more detail herein.

In addition to the memory devices mentioned above, other devices are continually being developed with many improvements resulting. Such improvements often result in larger memory size, measured in units of bytes and typically expressed in megabytes (MB), the speed at which the memory device performs, expressed in MHz, as well as the bus width, expressed in bits. It is contemplated that numerous types of memory devices, both those available now, as well as those available in the future, may be implemented with the presently disclosed invention.

Figure 3A:
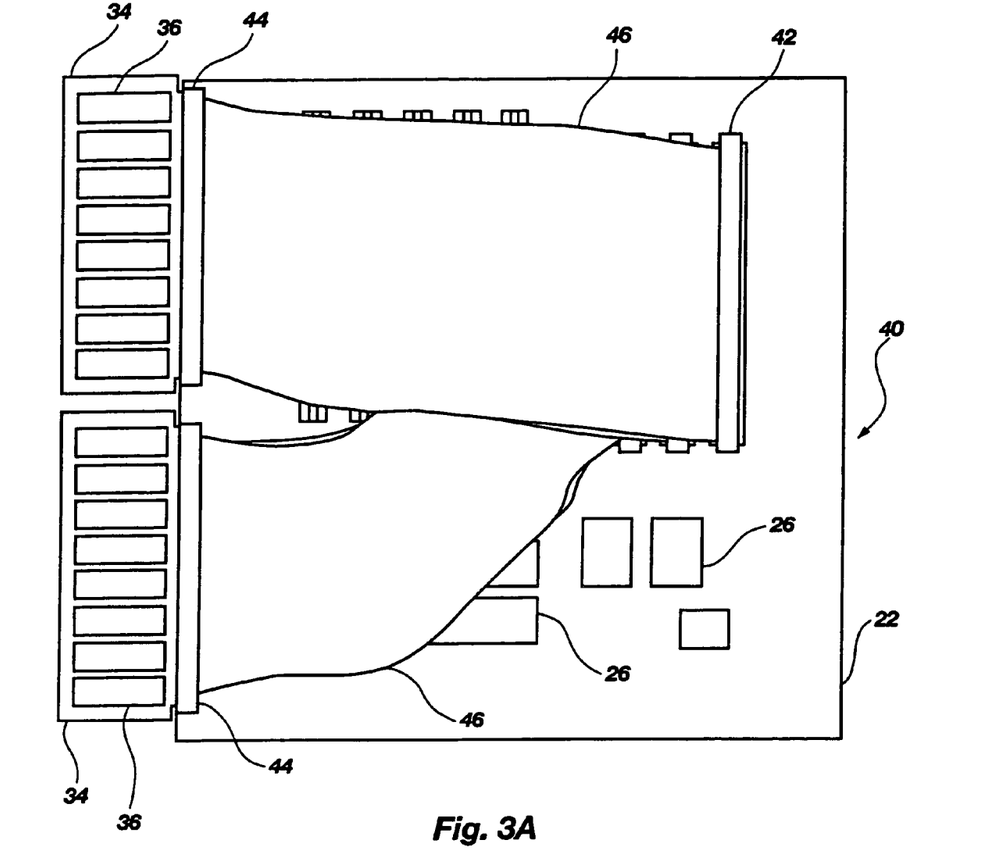
FIG. 3A is a plan view of a testing assembly according to one embodiment of the invention.
Figure 3B:
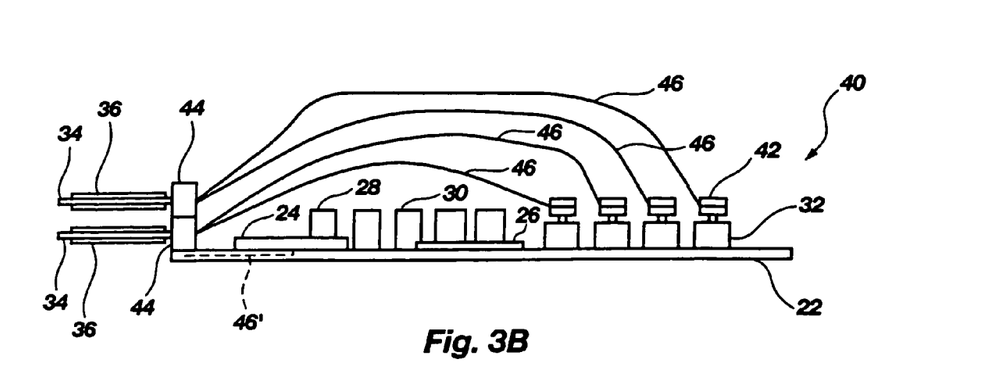
FIG. 3B is an elevational view of the testing assembly disclosed in FIG. 3A.

Referring to FIGS. 3A and 3B, and using like numerals for like components, a motherboard 40 is depicted, which is similar to that described above with respect to FIG. 1 and like features are identified with like reference numerals. The motherboard again includes a CPU 24, input/output slots 28 and 30, and resident memory sockets 32. However, an adapter 42 is coupled with each resident memory socket 32 instead of a memory device 34. The adapter 42 includes an interface similar to those of the memory devices 34 so that it may be inserted into the resident memory socket 32 and make an operable electrical connection therewith without modification to the remote memory socket 44. In addition to the resident memory sockets 32, remote memory sockets 44 are located at a periphery of the carrier substrate 22. The remote memory sockets 44 are of the same configuration as the resident memory sockets 32. In other words, each remote memory socket 44 is configured to receive a memory device 34 of the same type that would be received by the resident memory socket 32. However, it is noted that resident memory sockets 32 are conventionally mechanically and electrically connected to the motherboard 40 by a means which may include the soldering of individual electrical connections. Remote memory sockets 44, on the other hand, are not soldered and directly connected to circuit traces of the motherboard 40. Instead, they may be physically secured to carrier substrate 22 of motherboard 40 by use of adhesive, mechanical means such as screws or other fasteners, or, alternatively, the remote memory sockets 44 need not be attached to the motherboard 40 at all but merely placed adjacent thereto. While it is possible to place remote memory sockets 44 some distance from motherboard 40, this may be undesirable due to noise and signal phase considerations.

An electrical pathway 46 is provided between the adapter 42 and the remote memory socket 44. The electrical pathway 46 may be formed of appropriately sized multiconductor wiring such as ribbon cable. The memory devices 34 are inserted into the remote memory sockets 44 for operational or testing purposes. It is noted that while insertion of a memory device 34 into a resident memory socket 32 would require a force vector applied in a substantially perpendicular direction to the planar surface of the carrier substrate 22, insertion of a memory device 34 into a remote memory socket 44 of the presently described embodiment may be accomplished as illustrated in FIGS. 3A and 3B through the application of force in a direction substantially parallel to the planar surface of the carrier substrate 22.

A conductive path is formed between the CPU 24 and the resident memory socket 32 through the circuit traces of the carrier substrate 22 as is well understood in the art. The electrical pathway 46 of the presently disclosed embodiment continues through the resident memory socket 32, through the adapter 42, and through the electrical pathway 46 to the remote memory socket 44. Thus, any signal communicated from the CPU 24 through the motherboard 40 to the resident memory socket 32 will continue to the remote memory socket 44 and will ultimately be conveyed to the memory device 34. This allows the locale of the memory devices 34 to be user defined for convenience of access, during testing or other operations. Thus, the memory devices 34 need not be constrained to the position(s) as fixed by memory socket location of any given motherboard design whether it be a standard or proprietary design.

Figure 4A:
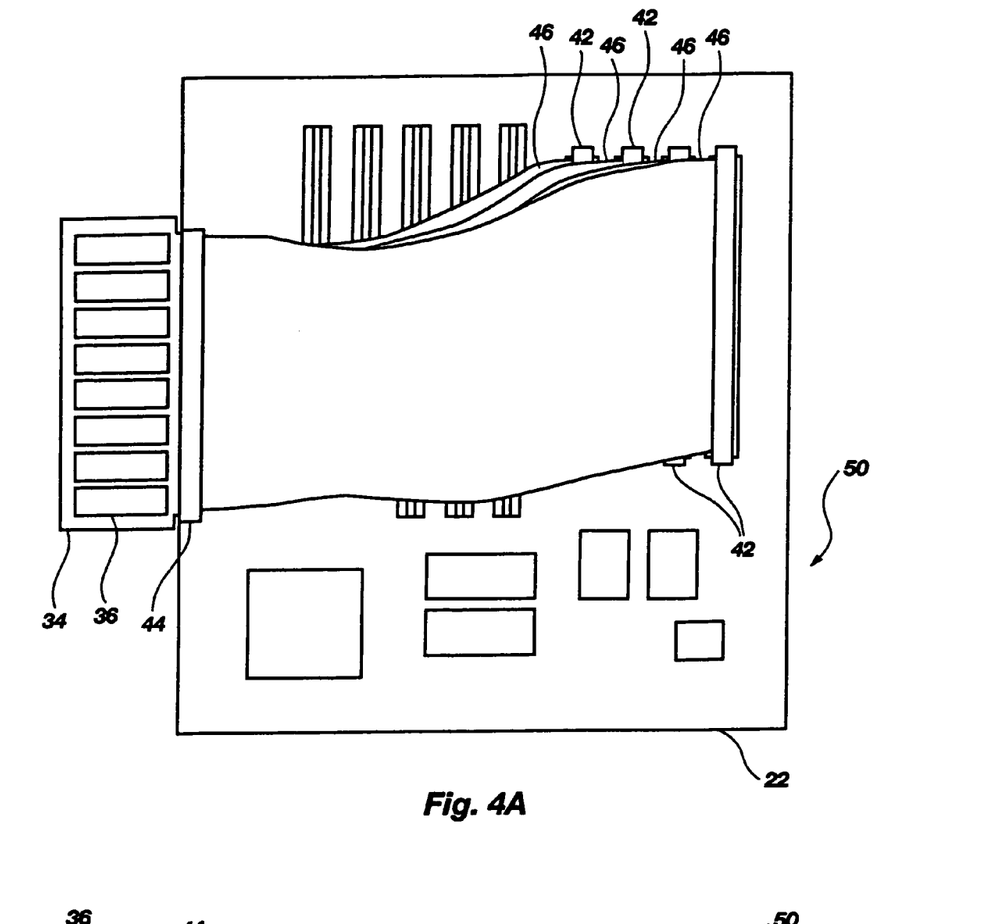
FIG. 4A is a plan view of a testing assembly according to another embodiment of the invention.
Figure 4B:
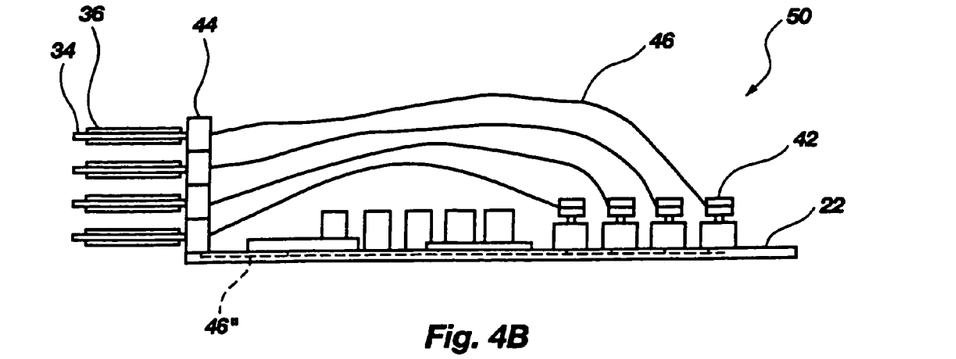
FIG. 4B is an elevational view of the testing assembly disclosed in FIG. 4A.

It is noted that the embodiment disclosed in FIGS. 3A and 3B shows the remote memory sockets 44 to be positioned such that they form a two-by-two array on an edge of the motherboard 40. However, this arrangement is not to be taken as limiting in any sense. The position of the remote memory sockets 44, as noted above, may be user defined. Thus, for example, FIGS. 4A and 4B show a motherboard 50 having similar associated features as those disclosed above with respect to motherboard 40, but with a different arrangement of the remote memory sockets 44. In FIGS. 4A and 4B, the remote memory sockets 44 are arranged to be in a one-by-four stacked array. Also, the embodiments shown in FIGS. 3A, 3B, 4A, and 4B show the remote memory sockets 44 to be positioned with their respective lengths running parallel to the plane of the carrier substrate 22. However, the remote memory sockets 44 may be arranged so that their respective lengths run perpendicular, or at some other predefined angle, to the plane of the carrier substrate 22. Furthermore, while the disclosed embodiments have shown the remote memory sockets 44 located together on a common edge of motherboard 40, 50, they may be distributed along multiple edges. For example, the remote memory sockets 44 may be distributed along opposing edges of the motherboard's periphery. Alternatively, adjacent edges of the periphery may include a distribution of remote memory sockets 44. Indeed, remote memory sockets 44 may be located along each edge of the motherboard's periphery.

It is also noted that while the disclosed embodiments have been shown and described as having an adapter 42 with an external physical connection between the adapter 42 and the remote memory socket 44, a motherboard according to the invention need not be so structured. In contrast to such an arrangement, the circuit traces of the carrier substrate 22 may be designed for direct connection of each remote memory socket 44 adjacent an edge of the motherboard 40 as shown by electrical pathway 46' in FIG. 3B. Alternatively, a motherboard may be designed having connections for a memory socket in both the conventional locations and in remote locations, such as at an edge or periphery of the carrier substrate 22, as shown by electrical pathway 46" in FIG. 4B. By designing the circuitry of a motherboard to allow connection of a memory socket in either of the locations described, the motherboard may be provided for alternate use, either for conventional operation in a computer system, such as a personal computer, or for a testing system where access to memory modules is of some significance.

Figure 5:
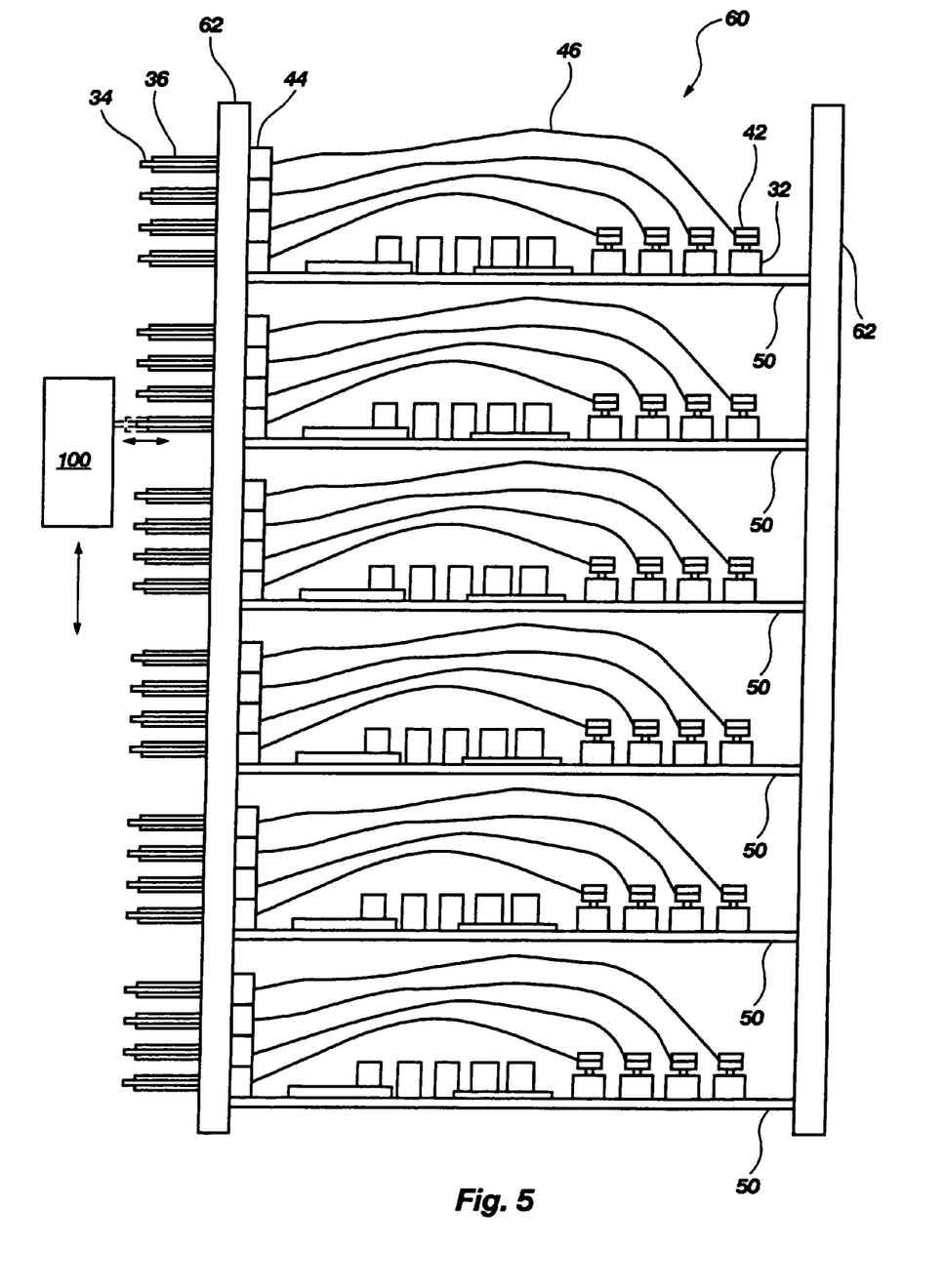
FIG. 5 is an elevational view of a testing system according to one aspect of the invention.

Referring now to FIG. 5, a memory testing system 60 is shown utilizing multiple motherboards 50 as disclosed in the embodiment associated with FIGS. 4A and 4B. The memory testing system 60 includes a frame 62 to which is secured a plurality of motherboards 50. Each motherboard 50 includes a plurality of remote memory sockets 44 electrically coupled to resident memory sockets 32 via an electrical pathway 46 and an adapter 42. The remote memory sockets 44 may be fixed to the motherboards 50 or, alternatively, they may be coupled to the frame 62 or another fixture adjacent the motherboards 50. By placing the remote memory sockets 44 adjacent a periphery of each motherboard 50, the motherboards 50 may be stacked or arranged in closer proximity to one another without the concern of restricting access to the memory devices 34.

With the flexibility in locating the remote memory sockets 44, the memory testing system 60 may be adapted for use with an automated handling unit for programmed removal and replacement of the individual memory devices 34. Such a handler, schematically illustrated at 100 in FIG. 5, may be designed and programmed such that human intervention is at a minimum and that the entire memory testing system 60 may be automated, including insertion and removal of memory devices 34 in remote memory sockets 44. For example, upon receipt of an appropriate command signal, the automated handler 100 might install memory devices 34 into each of the remote memory sockets 44. After each memory module is in place, test signals may be passed to the memory devices 34 with the response to such signals being monitored according to defined testing instructions and parameters. After analyzing the response of each memory device 34 and determining whether each module passes or fails the test, the automated handler 100 may then be commanded, for example, to remove the modules which failed and dispose of them properly. The automated handler 100 may then be commanded to collect the modules that passed the test and distribute them to a further stage of production, whether that be additional testing or packaging for shipment.

Again, it is noted that while the remote memory sockets 44 of the memory testing system 60 have been shown in FIG. 5 as being arranged in a one-by-four array, this configuration should not be construed as limiting. The remote memory sockets 44 may be arranged as disclosed in accordance with the embodiment of FIGS. 3A and 3B showing a two-by-two array, or they may be located according to other various operator-defined arrangements. The remote memory sockets 44 are contemplated as being susceptible to an arrangement in accordance with the invention in the most efficient user-defined configuration within the constraints of the specific testing facilities.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of testing a memory device comprising:
providing at least one motherboard assembly, the at least one motherboard assembly including a substrate having a planar surface, at least one processor, and at least one resident memory socket fixed to the substrate;
providing at least one remote memory socket;
coupling the at least one remote memory socket with the at least one resident memory socket;
coupling a memory module with the at least one remote memory socket;
providing a signal from the at least one motherboard assembly to the memory module via the at least one resident memory socket and the at least one remote memory socket; and
evaluating the performance of the memory module by monitoring an output from the memory module responsive to the signal with the at least one motherboard assembly.

2. The method according to claim 1, further comprising locating the at least one remote memory socket at a periphery of the at least one motherboard assembly.

3. The method according to claim 1, wherein coupling the memory module with the at least one remote memory socket includes inserting a portion of the memory module into the at least one remote memory socket in a direction that is substantially parallel with the planar surface.

4. The method according to claim 3, wherein coupling the at least one remote memory socket with the at least one resident memory socket includes coupling an adapter with the at least one resident memory socket.

5. The method according to claim 4, wherein coupling an adapter with the at least one resident memory socket includes inserting a portion of the adapter into a slot of the at least one resident memory socket in a direction substantially perpendicular to the planar surface.

* * * * *